(12) United States Patent
Wang

(10) Patent No.: US 8,987,734 B2
(45) Date of Patent: Mar. 24, 2015

(54) SEMICONDUCTOR WAFER, SEMICONDUCTOR PROCESS AND SEMICONDUCTOR PACKAGE

(71) Applicant: Advanced Semiconductor Engineering, Inc., Kaohsiung (TW)

(72) Inventor: Yung-Hui Wang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 106 days.

(21) Appl. No.: 13/843,304

(22) Filed: Mar. 15, 2013

(65) Prior Publication Data

US 2014/0264716 A1    Sep. 18, 2014

(51) Int. Cl.
| | |
|---|---|
| *H01L 23/58* | (2006.01) |
| *H01L 21/66* | (2006.01) |
| *H01L 27/04* | (2006.01) |
| *H01L 23/00* | (2006.01) |

(52) U.S. Cl.
CPC ............... *H01L 22/14* (2013.01); *H01L 27/04* (2013.01); *H01L 24/73* (2013.01); *H01L 2224/48465* (2013.01)
USPC ............. 257/48; 257/621; 438/460; 438/462; 438/622

(58) Field of Classification Search
USPC ....................... 438/460, 462, 622; 257/48, 621
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,404,044 A | 4/1995 | Booth et al. |
| 5,615,477 A | 4/1997 | Sweitzer |
| 5,643,831 A | 7/1997 | Ochiai et al. |
| 5,998,292 A | 12/1999 | Black et al. |
| 6,276,599 B1 | 8/2001 | Ogawa |
| 6,329,631 B1 | 12/2001 | Yueh |
| 6,406,934 B1 | 6/2002 | Glenn et al. |
| 6,448,506 B1 | 9/2002 | Glenn et al. |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — David Vu
*Assistant Examiner* — Brandon Fox
(74) *Attorney, Agent, or Firm* — Morgan Law Offices, PLC

(57) ABSTRACT

The present invention provides a semiconductor wafer, semiconductor package and semiconductor process. The semiconductor wafer includes a substrate, at least one metal segment and a plurality of dielectric layers. The semiconductor wafer is defined as a plurality of die areas and a plurality of trench areas, each of the die areas has an integrated circuit including a plurality of patterned metal layers disposed between the dielectric layers. The trench areas are disposed between the die areas, and the at least one metal segment is disposed in the trench area and insulated from the integrated circuit of the die area.

17 Claims, 12 Drawing Sheets

(56) References Cited

U.S. PATENT DOCUMENTS

| | | |
|---|---|---|
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,498,675 B2 * | 3/2009 | Farnworth et al. ............ 257/723 |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara et al. |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 * | 11/2010 | Chen ............................ 257/48 |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0156220 A1 * | 6/2011 | Kogawa et al. ............... 257/620 |

* cited by examiner

SEMICONDUCTOR WAFER, SEMICONDUCTOR PROCESS AND SEMICONDUCTOR PACKAGE

BACKGROUND OF THE INVENTION

1. Field of the Invention

The present invention relates to the field of 3D semiconductor packaging, and, more particularly, to techniques and structures used to facilitate testing of conductive vias.

2. Description of the Related Art

In stacked-chip packaging, multiple integrated circuit chips can be packaged in a single package structure in a vertically stacked manner. This increases stack density, making the package structure smaller, and often reduces the length of the path that signals must traverse between chips. Thus, stacked-chip packaging tends to increase the speed of signal transmission between or among chips. Additionally, stacked-chip packaging allows chips having different functions to be integrated in a single package structure. Use of through silicon vias (TSV) has been a key technology in realizing stacked-chip packaging integration due to the ability to provide short vertical conductive paths between chips.

Conventionally, in the TSV manufacturing process, a semiconductor wafer is etched from its bottom surface to form a plurality of via holes such that a bottommost patterned metal layer (i.e., "metal one" (M1)) of the semiconductor wafer is exposed. Then, the via holes are plated with a conductive metal so as to form the through silicon vias (TSVs). The semiconductor wafer is then sawed to form semiconductor dice. In some cases, during the etching process of the semiconductor wafer, the etchant may not etch the semiconductor wafer precisely, so that some via holes will not reach to the bottommost patterned metal layer (M1). In other cases, during the plating process of the conductive metal, the plating parameter may not be controlled well, so that the thickness of the conductive metal is not even, and some conductive metal will not contact the bottommost patterned metal layer (M1). The above two cases will result in that the conductive metal of the TSV will not stop on the bottommost patterned metal layer (M1) perfectly in the plating process, and an open circuit is formed between the conductive metal and the bottommost patterned metal layer (M1). However, such undesired defects are found only upon performing a test on the semiconductor die, which means such undesired defects are found only after the semiconductor wafer had been sawed into the semiconductor dice.

SUMMARY OF THE INVENTION

One aspect of the disclosure relates to a semiconductor package. In one embodiment, the semiconductor package includes a semiconductor die, which comprises a substrate; a plurality of dielectric layers, disposed on the substrate; an integrated circuit, including a plurality of patterned metal layers disposed between the dielectric layers and electrically connected to each other; and at least one metal segment, insulated from the integrated circuit and exposed from a lateral side surface of the semiconductor die. In this embodiment, the at least one metal segment is disposed on a dielectric layer which is the bottommost of the dielectric layers, at least one metal segment and a bottommost patterned metal layer of the integrated circuit each have lower surfaces which are substantially coplanar, and the semiconductor die further comprises at least one conductive via.

Another aspect of the disclosure relates to a semiconductor wafer. In one embodiment, the semiconductor wafer includes a substrate divided into a plurality of die areas and a plurality of trench areas; wherein each of the die areas includes an integrated circuit having a plurality of patterned metal layers disposed between dielectric layers and electrically connected to each other; and wherein the trench areas are disposed between the die areas, and at least one metal segment is disposed in the trench area and insulated from the integrated circuit of an adjacent die area. In this embodiment, the at least one metal segment is disposed on a bottommost dielectric layer, and the at least one metal segment and a bottommost patterned metal layer are coplanar at the same layer.

Another aspect of the disclosure relates to a semiconductor process. In one embodiment, the semiconductor process comprises (a) providing a semiconductor wafer having a substrate, at least one metal segment, a plurality of integrated circuits and a plurality of dielectric layers, wherein the at least one metal segment, the integrated circuits and the dielectric layers are disposed on a top surface of the substrate, each of the integrated circuits includes a plurality of patterned metal layers disposed between the dielectric layers and electrically connected to each other, and the at least one metal segment is insulated from the integrated circuits; (b) forming a plurality of testing holes and inner holes from a bottom surface of the substrate to expose the at least one metal segment and a bottommost patterned metal layer of the integrated circuit, respectively; (c) forming a plurality of conductive metals in the testing holes and the inner holes, wherein the conductive metals in the testing holes are separated from each other; and (d) probing at least two of the conductive metals in two of the testing holes. The semiconductor wafer is defined as a plurality of die areas and a plurality of trench areas, each of the die areas has each of the integrated circuits, and the trench areas are disposed between the die areas. In an embodiment, the at least one metal segment is disposed in the trench area. In an alternate embodiment, the at least one metal segment is disposed in the die areas. In an embodiment, the at least one metal segment can be disposed on a bottommost dielectric layer, the at least one metal segment and a bottommost patterned metal layer of the integrated circuit are coplanar at the same layer. In step (c), the conductive metals can be plated on a sidewall of each of the testing holes and a sidewall of each of the inner holes. Furthermore, in step (c), the conductive metals can fill the testing holes and the inner holes, the conductive metals in the testing holes can further extend to the bottom surface of the substrate to form a plurality of testing portions used to be probed in step (d), and the conductive metals in the testing holes can contact the at least one metal segment, and the conductive metals in the inner holes contact the bottommost patterned metal layer of the integrated circuit. The semiconductor process further includes the step of sawing the semiconductor wafer along the trench areas to form a plurality of semiconductor die. During the sawing process, the at least one metal segment and the conductive metals in the testing holes may be removed.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
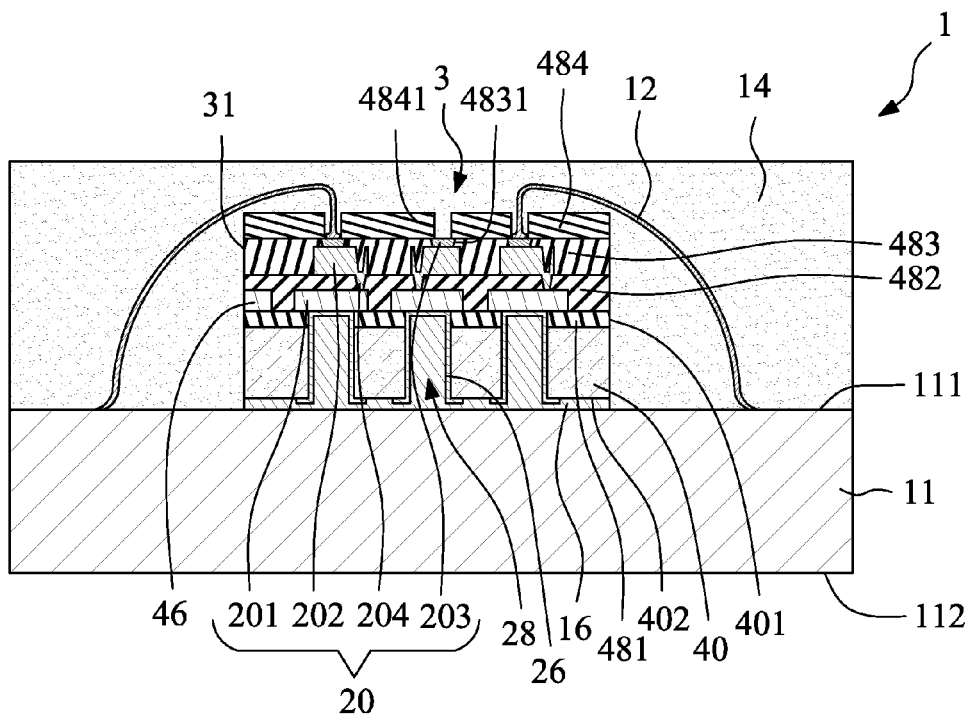
FIG. 1 illustrates a cross-sectional view of a semiconductor package according to an embodiment of the present invention.

Referring to FIG. 1, a cross-sectional view of a semiconductor package 1, according to an embodiment of the present invention, is illustrated. The semiconductor package 1 comprises a package substrate 11, a semiconductor die 3, a plurality of bonding wires 12, a molding compound 14 and a solder layer 16. The package substrate 11 has a top surface 111 and a bottom surface 112. The semiconductor die 3 is disposed on the top surface 111 of the package substrate 11. In this embodiment, the semiconductor die 3 comprises a substrate 40, a plurality of dielectric layers 481, 482, 483, 484, an integrated circuit 20, a part of a metal segment 46, four side surfaces 31 and a plurality of conductive vias 28. The substrate 40 has a top surface 401 and a bottom surface 402. The metal segment 46 and the dielectric layers 481, 482, 483, 484 are disposed on the top surface 401 of the substrate 40. The bottommost dielectric layer 481 is directly disposed on the top surface 401 of the substrate 40, and the second dielectric layer 482, the third dielectric layer 483 and the fourth dielectric layer 484 are disposed on the bottommost dielectric layer 481, in this order. The integrated circuit 20 includes a plurality of patterned metal layers 201, 202, 203 and a plurality of interconnection metals 204. The patterned metal layers 201, 202, 203 are disposed between the dielectric layers 481, 482, 483, 484 and electrically connected to each other. The metal segment 46 is insulated from the integrated circuit 20. That is, the metal segment 46 is not electrically connected to the integrated circuit 20. The metal segment 46 and the bottommost patterned metal layer 201 of the integrated circuit 20 are substantially coplanar at the same layer. It is noted that the integrated circuit 20 is not exposed from the four side surfaces 31 of the semiconductor die 3, but part of the metal segment 46 is exposed from a side surface 31 of the semiconductor die 3.

The solder layer 16 is used for bonding the bottom surface 402 of the substrate 40 of the semiconductor die 3 to the top surface 111 of the package substrate 11. In this embodiment, a portion of the solder layer 16 may fill part of the central hole defined by the conductive metal 26 in the conductive via 28. The integrated circuit 20 is electrically connected to the package substrate 11 through the conductive via 28 and the solder layer 16 for grounding such that the inductance is low. The bonding wires 12 electrically connect the third patterned metal layer 203 of the integrated circuit 20 and the top surfaces 111 of the package substrate 11. The molding compound 14 encapsulates the semiconductor die 3, the bonding wires 12 and a part of the package substrate 11.

Figure 2:
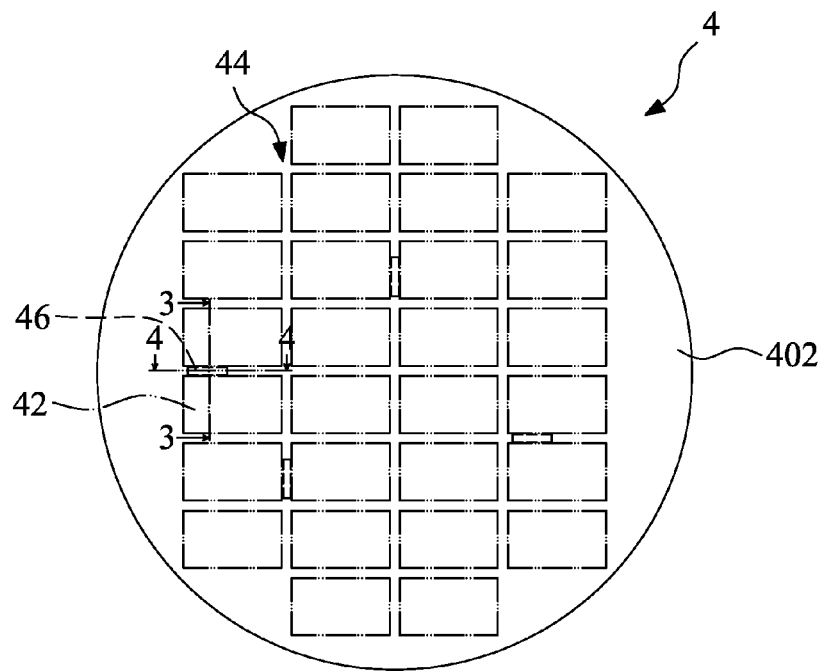
FIGS. 2 to 16 illustrate a process for making a semiconductor die according to an embodiment of the present invention.

Referring to FIGS. 2 to 16, a process for making a semiconductor die according to an embodiment of the present invention is illustrated. Referring to FIG. 2, a semiconductor wafer 4 is provided, wherein a bottom view of the semiconductor wafer 4, according to an embodiment of the present invention, is illustrated. The semiconductor wafer 4 is defined as a plurality of die areas 42 and a plurality of trench areas 44. The die areas 42 are predetermined, arranged in an array, and will become each of the semiconductor die 3 (FIG. 1) after the semiconductor wafer 4 is sawed. The trench areas 44 are disposed between the die areas 42. In this embodiment, the trench areas 44 include "saw streets" that will be removed during the sawing step. The semiconductor wafer 4 comprises at least one metal segment 46. In this embodiment, the metal segment 46 is disposed in the trench area 44. However, in other embodiments, the metal segment 46 may be disposed in the die area 42.

Figure 3:
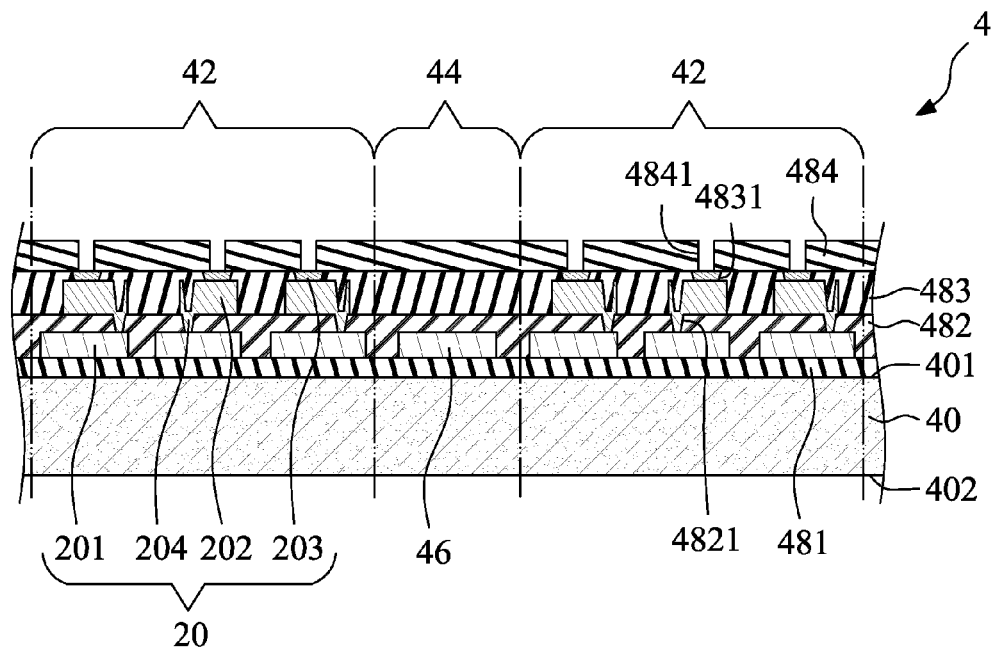

Referring to FIG. 3, a cross-sectional view taken along line 3-3 of FIG. 2 is illustrated. The semiconductor wafer 4 comprises a substrate 40, the metal segment 46 and a plurality of dielectric layers. In this embodiment, the material of the substrate 40 is a semiconductor material such as silicon or germanium. The substrate 40 has a top surface 401 and a bottom surface 402. The metal segment 46 and the dielectric layers are disposed on the top surface 401 of the substrate 40. The dielectric layers are inter-level dielectrics which include, but are not limited to, a bottommost dielectric layer 481, a second dielectric layer 482, a third dielectric layer 483 and a fourth dielectric layer 484. Each of the dielectric layers 481, 482, 483, 484 may comprise a dielectric layer with a low dielectric constant (K) (less than 3.4) or an ultra-low dielectric constant (K) (less than 2.5), and the material of the dielectric layers 481, 482, 483, 484 may be the same as, or different from, each other. The bottommost dielectric layer 481 is directly disposed on the top surface 401 of the substrate 40, and the second dielectric layer 482, the third dielectric layer 483 and the fourth dielectric layer 484 are disposed on the bottommost dielectric layer 481 in sequence. The second dielectric layer 482 has a plurality of openings 4821, the third dielectric layer 483 has a plurality of openings 4831, and the fourth dielectric layer 484 has a plurality of openings 4841.

The die area 42 has an integrated circuit 20 including a plurality of patterned metal layers and a plurality of interconnection metals 204. The patterned metal layers include, but are not limited to, a bottommost patterned metal layer 201, a second patterned metal layer 202 and a third patterned metal layer 203. The patterned metal layers 201, 202, 203 are disposed between the dielectric layers 481, 482, 483, 484 and electrically connected to each other. The material of the patterned metal layers 201, 202, 203 is copper (Cu). In this embodiment, the bottommost patterned metal layer 201 is disposed on the bottommost dielectric layer 481, and covered by the second dielectric layer 482. The second patterned metal layer 202 is disposed on the second dielectric layer 482, and covered by the third dielectric layer 483. The interconnection metals 204 are disposed in the openings 4821 of the second dielectric layer 482 for electrically connecting the bottommost patterned metal layer 201 and the second patterned metal layer 202. The third patterned metal layer 203 is disposed in the openings 4831 of the third dielectric layer 483 for electrically connecting the second patterned metal layer 202. The openings 4841 of the fourth dielectric layer 484 expose the third patterned metal layer 203.

In this embodiment, the metal segment 46 is disposed in the trench area 44 and is insulated from the integrated circuit 20 of the die area 42. That is, the metal segment 46 is not electrically connected to the integrated circuit 20. The metal segment 46 is disposed on the bottommost dielectric layer 481 directly. That is, the metal segment 46 and the bottommost patterned metal layer 201 of the integrated circuit 20 are coplanar at the same layer, and they are formed at the same time with the same material. In other embodiments, the metal segment 46 is disposed in the die area 42 but is insulated from the integrated circuit 20. It is noted that the metal segment 46 is not a part of the bottommost patterned metal layer 201.

Figure 4:
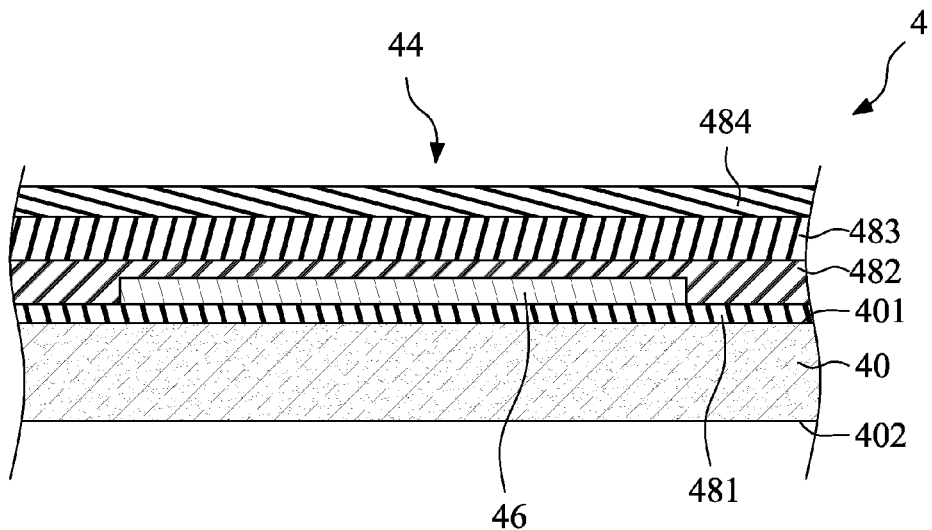

Referring to FIG. 4, a cross-sectional view taken along line 4-4 of FIG. 2 is illustrated. In this embodiment, the metal segment 46 is disposed within the trench area 44, and there is no patterned metal layer disposed above the metal segment 46. However, if the metal segment 46 will be disposed within the die area 42, then the second patterned metal layer 202 may be disposed above the metal segment 46.

Figure 5:
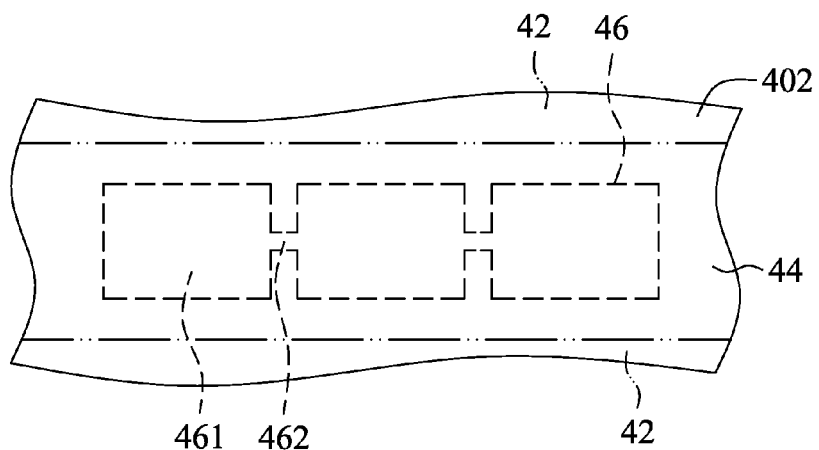

Referring to FIG. 5, a bottom view of FIG. 4 is illustrated. The metal segment 46 includes three pad portions 461 and two connecting portions 462. The connecting portions 462 connect the pad portions 461. The width of the connecting portion 462 is less than that of the pad portion 461.

Figure 6:
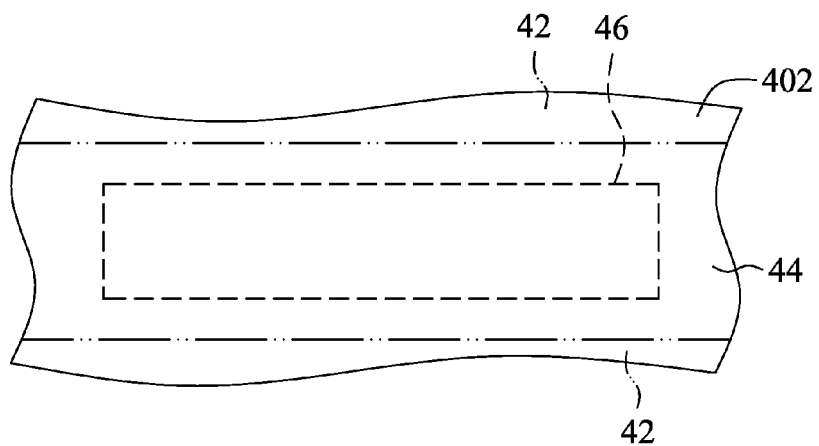

Referring to FIG. 6, another example of FIG. 5 is illustrated. In this example, the metal segment 46 is rectangular and has an equal width.

Figure 7:
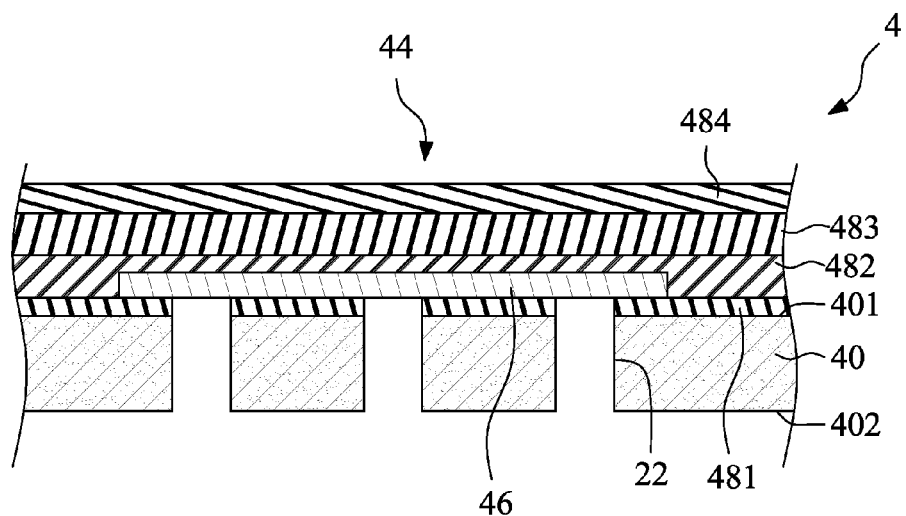

Referring to FIG. 7, a plurality of testing holes 22 are formed from the bottom surface 402 of the substrate 40 by etching to expose the metal segment 46. The testing holes 22 extend through the substrate 40 and the bottommost dielectric layer 481. In this embodiment, one metal segment 46 corresponds to three testing holes 22.

Figure 8:
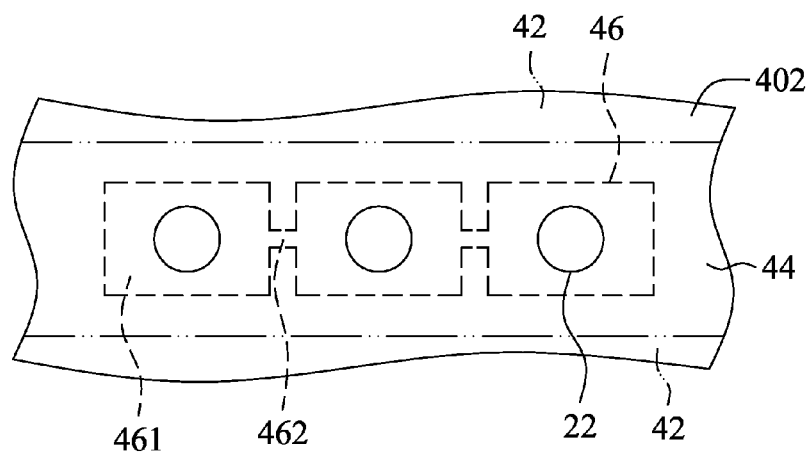

Referring to FIG. 8, a bottom view of FIG. 7 is illustrated. Each of the pad portions 461 corresponds to each of the testing holes 22.

Figure 9:
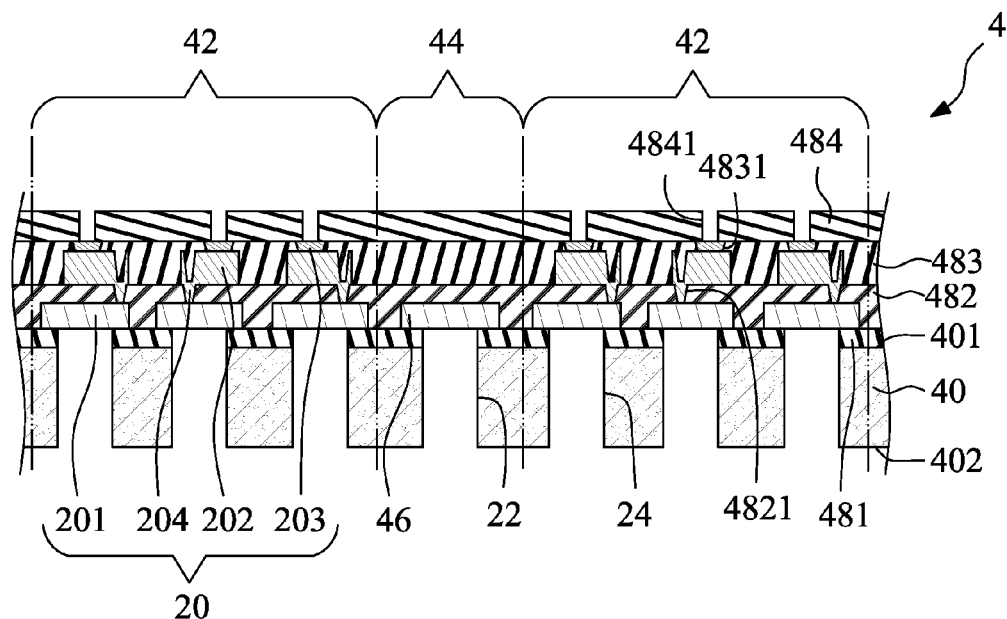

Referring to FIG. 9, a cross-sectional view taken along a direction perpendicular to FIG. 7 is illustrated. A plurality of inner holes 24 are formed from the bottom surface 402 of the substrate 40 by etching to expose the bottommost patterned metal layer 201 of the integrated circuit 20 in the die area 42. The inner holes 24 extend through the substrate 40 and the bottommost dielectric layer 481. In this embodiment, the diameter of the inner hole 24 is about equal to that of the testing hole 22. However, in other embodiments, the diameter of the inner hole 24 is different from that of the testing hole 22.

Figure 10:
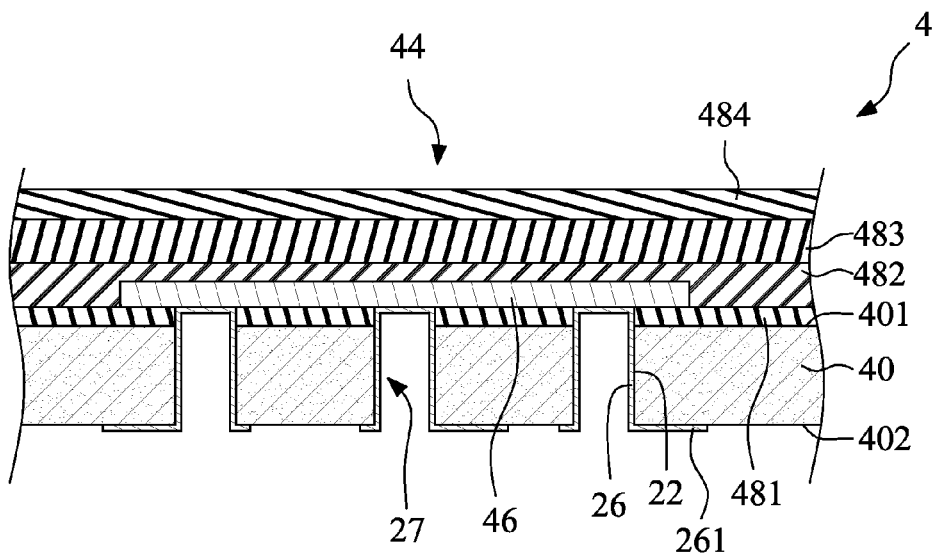

Referring to FIG. 10, a plurality of conductive metals 26 are formed in the testing holes 22 by plating so as to form a plurality of testing vias 27 in the testing holes 22. The material of the conductive metals 26 is copper (Cu). Preferably, the conductive metals 26 contact the metal segment 46 so that the conductive metals 26 situate on the metal segment 46. It is noted that the conductive metals 26 in the testing holes 22 are separated from each other. That is, they are not physically connected to each other. The conductive metals 26 in the testing holes 22 further extend to the bottom surface 402 of the substrate 40 to form a plurality of testing portions 261 for which can be probed. In this embodiment, the conductive metals 26 are plated on a sidewall of each of the testing holes 22. However, in other embodiments, the conductive metals 26 fill the testing holes 22.

Figure 11:
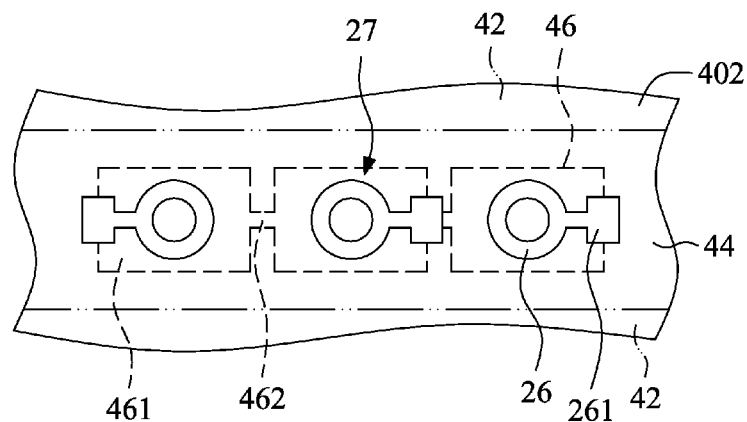

Referring to FIG. 11, a bottom view of FIG. 10 is illustrated. Each of the conductive metals 26 has one testing portion 261. Preferably, the conductive metals 26 contact the metal segment 46.

Figure 12:
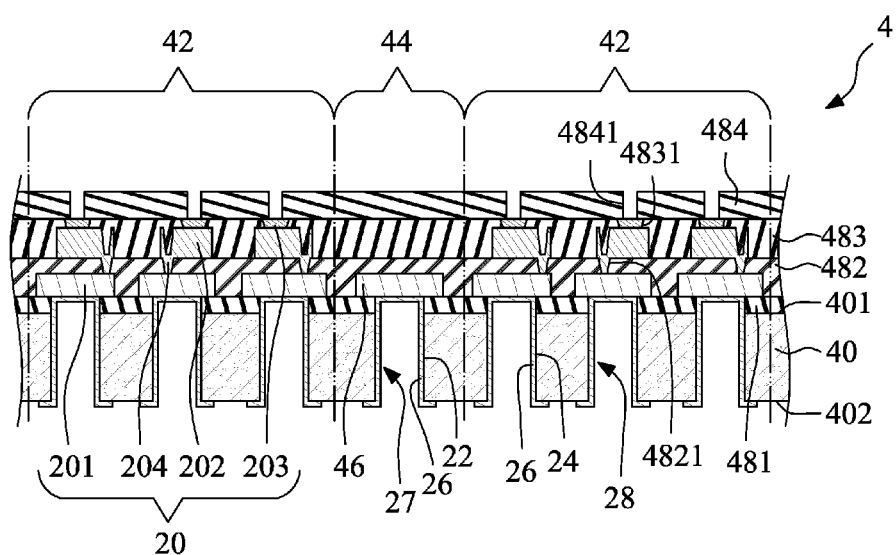

Referring to FIG. 12, a cross-sectional view taken along a direction perpendicular to FIG. 10 is illustrated. The conductive metals 26 are also formed in the inner holes 24 by plating so as to form a plurality of conductive vias 28 in the inner holes 24. Preferably, the conductive metals 26 contact the bottommost patterned metal layer 201 so that the conductive metals 26 end on the bottommost patterned metal layer 201. In this embodiment, the conductive metals 26 are plated on a sidewall of each of the inner holes 24. However, in other embodiments, the conductive metals 26 fill the inner holes 24.

Figure 13:
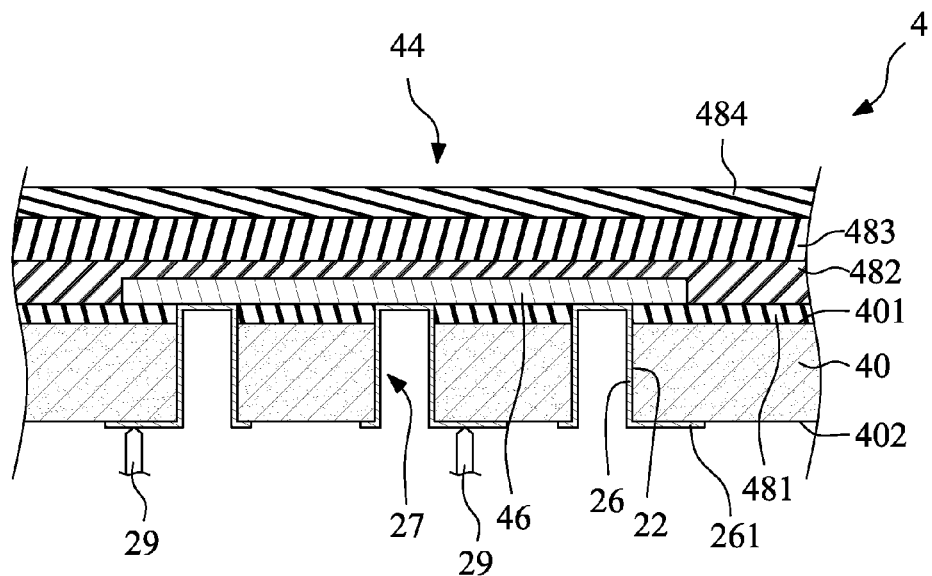

Referring to FIG. 13, probing of the conductive metals 26 is done. As shown, any two of the conductive metals 26 in two of the testing holes 22 are probed by using two probes 29. In this embodiment, two probes 29 are used to contact two testing portions 261 respectively. If the conductive metals 26 in the two testing holes 22 create a short circuit (e.g., as determined by the measured resistance between the two probes 29 being lower than $100\Omega$), it is confirmed that the conductive metals 26 in the testing holes 22 situate on the metal segment 46 perfectly, and the conductive metals 26 in the inner holes 24 are presumed to stop on the bottommost patterned metal layer 201 perfectly. Furthermore, the conductive metal 28 and the conductive vias 26 are near to each other and formed simultaneously. When the conductive metals 26 are presumed to stop on metal, the conductive metals 28 can be presumed to stop on metal as well. Accordingly, the conductive vias 28 are determined to be formed properly and therefore "qualified"; the semiconductor wafer 4 can then be sawed or delivered. If the conductive metals 26 in the two testing holes 22 create an open circuit (e.g., as determined by the measured resistance between the two probes 29 being greater than or equal to $100\Omega$), it is confirmed that the conductive metals 26 in the testing holes 22 do not contact the metal segment 46, and additionally, it is presumed that the conductive metals 26 in the inner holes 24 fail to stop on the bottommost patterned metal layer 201. Furthermore, the conductive metal 28 and the conductive vias 26 are near to each other and formed simultaneously. When the conductive metals 26 are presumed to fail to stop on metal, the conductive metals 28 can be presumed failing to stop on metal as well. Therefore, the conductive vias 28 can be determined to be "unqualified." Therefore, the undesired defect of the unqualified conductive vias 28 is found before the semiconductor wafer 4 has been sawed or delivered. Thus, the wafer can be selected in time if such undesired defect happens and the yield of the wafer can be significantly enhanced.

Figure 14:
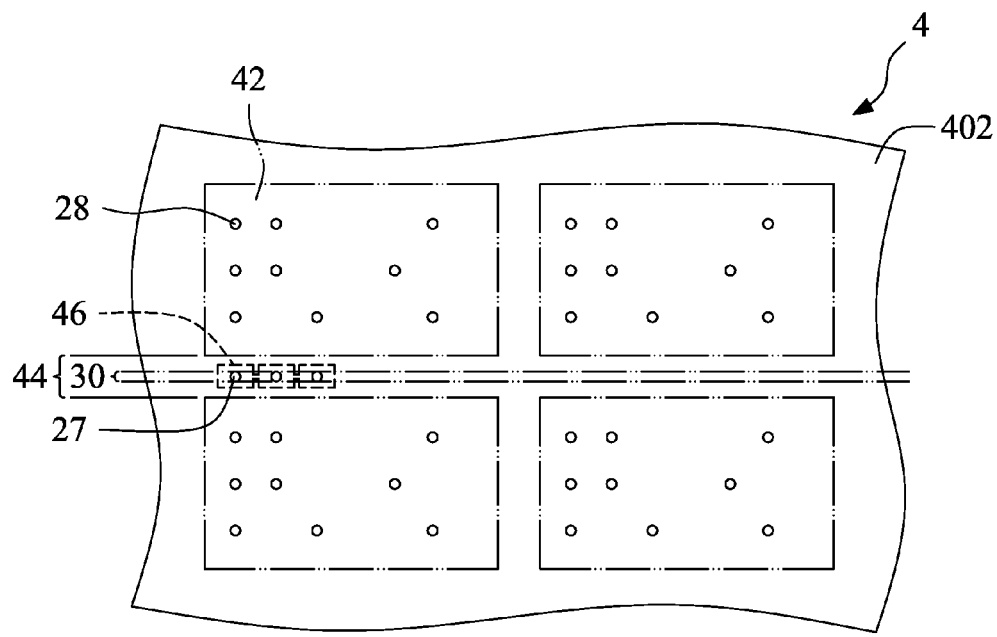
Figure 15:
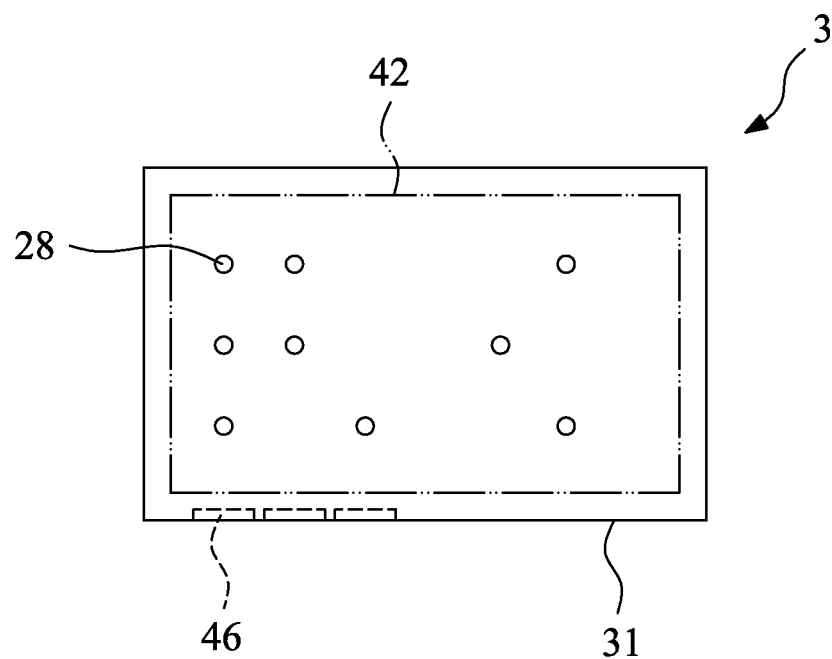
Figure 16:
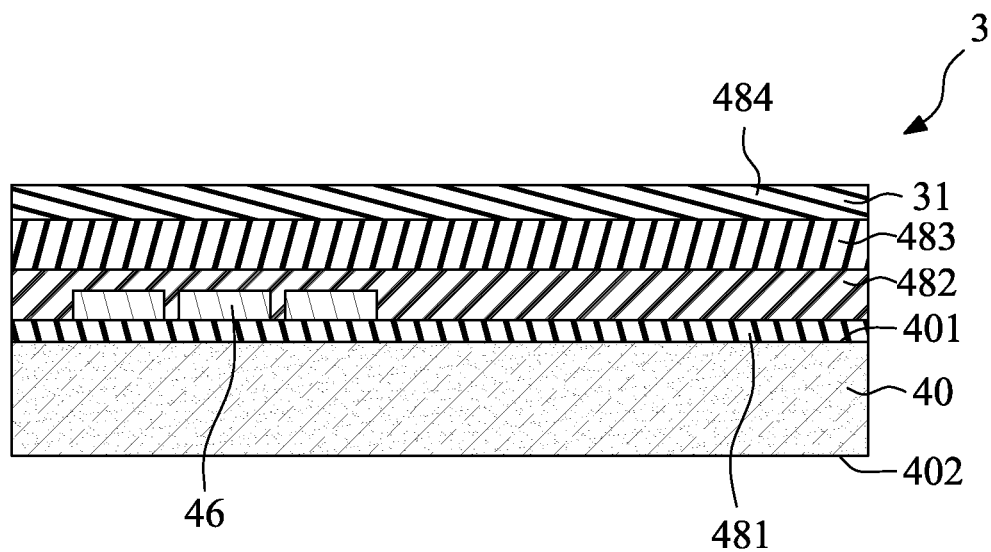

Referring to FIG. 14, the semiconductor wafer 4 is sawed along the trench areas 44 to remove a part of the metal segment 46 and the testing vias 27 to form a plurality of semiconductor dice 3 (FIGS. 15 and 16). The trench areas 44 are predetermined sawing streets, however, in the actual sawing process, the semiconductor wafer 4 is sawed along the real cutting paths 30. The real cutting path 30 is disposed within the trench area 44, and the width of the real cutting path 30 is narrower than that of the trench area 44. In this embodiment, the width of the real cutting path 30 is narrower than that of the metal segment 46, but is greater than that of the testing via 27 so that the testing via 27 is cut away but another part of the metal segment 46 remains.

Referring to FIGS. 15 and 16, a bottom view and a side view of the semiconductor die 3, respectively, according to an embodiment of the present invention are illustrated. The semiconductor die 3 comprises the substrate 40, the dielectric layers 481, 482, 483, 484, the integrated circuit 20, a part of the metal segment 46, four side surfaces 31 and the conductive vias 28. The substrate 40 has a top surface 401 and a bottom surface 402. The metal segment 46 and the dielectric layers 481, 482, 483, 484 are disposed on the top surface 401 of the substrate 40. The bottommost dielectric layer 481 is directly disposed on the top surface 401 of the substrate 40, and the second dielectric layer 482, the third dielectric layer 483 and the fourth dielectric layer 484 are disposed on the bottommost dielectric layer 481 in sequence. The integrated circuit 20 (FIG. 3) is disposed with the die area 42, and includes the patterned metal layers 201, 202, 203 and the interconnection metals 204. The patterned metal layers 201, 202, 203 are disposed between the dielectric layers 481, 482, 483, 484 and electrically connected to each other. The metal segment 46 is insulated from the integrated circuit 20 of the die area 12. That is, the metal segment 46 is not electrically connected to the integrated circuit 20. The metal segment 46 is disposed on the bottommost dielectric layer 201 directly. That is, the metal segment 46 and the bottommost patterned metal layer 201 of the integrated circuit 20 are at the same layer. The real die area of the semiconductor die 3 is defined by the four side surfaces 31, and is larger than the die area 42. It is noted that the integrated circuit 20 is not exposed from the four side surfaces 31 of the semiconductor die 3, but the part of the metal segment 46 is exposed from a lateral side surface 31 of the semiconductor die 3.

Figure 17:
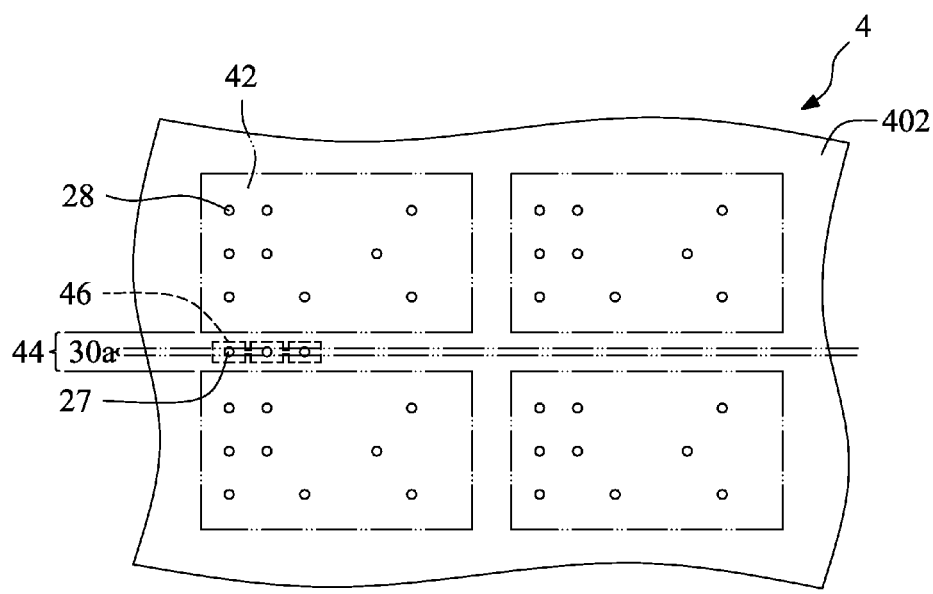
FIG. 17 illustrates a process for making a semiconductor die according to another embodiment of the present invention.

Referring to FIG. 17, a process for making a semiconductor die according to another embodiment of the present invention is illustrated. The semiconductor process of this embodiment is similar to the semiconductor process of FIGS. 2 to 16, and the difference involves the sawing process.

Figure 18:
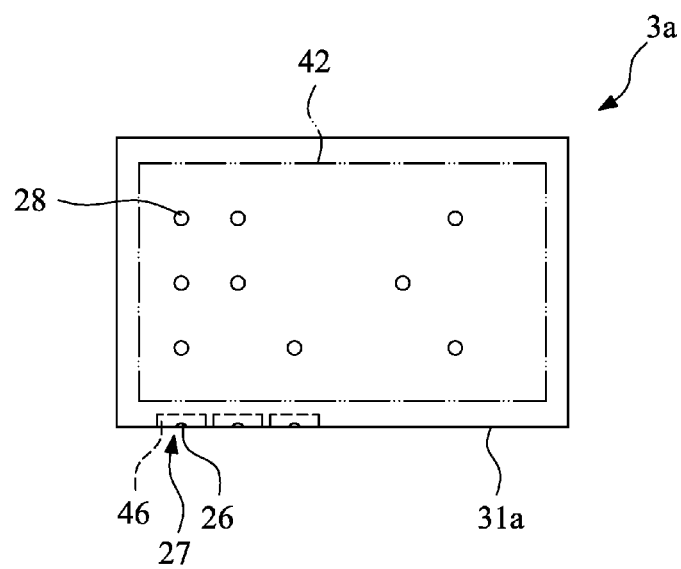
FIGS. 18 and 19 illustrate a bottom view and a side view, respectively, of a semiconductor die according to another embodiment of the present invention.
Figure 19:
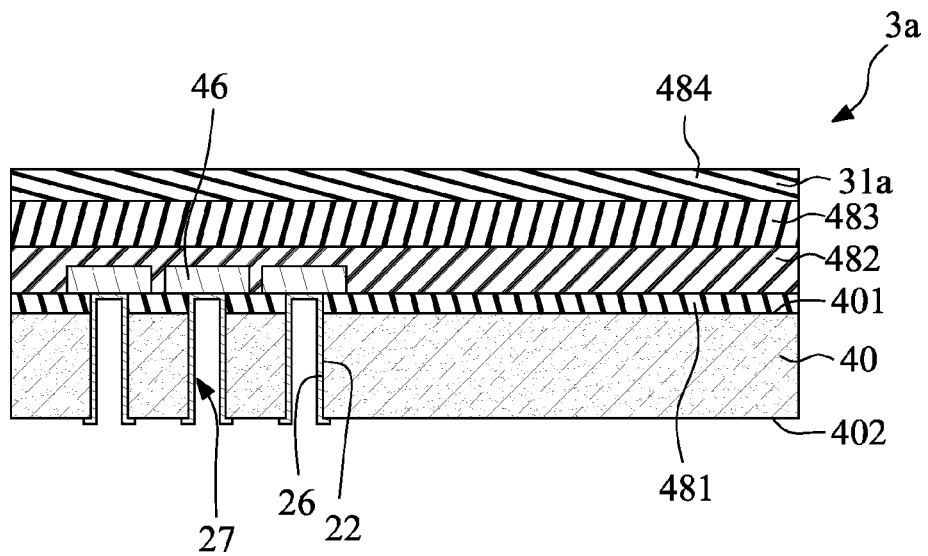

Referring to FIG. 17, the semiconductor wafer 4 is sawed along the trench areas 44 to remove the metal segment 46 and the testing vias 27 to form a plurality of semiconductor dice 3a (FIGS. 18 and 19). The trench areas 44 are predetermined sawing streets, however, in actual sawing process, the semiconductor wafer 4 is sawed along the real cutting paths 30a. The real cutting path 30a is narrower than that of the real cutting paths 30 of FIG. 14, and the width of the real cutting path 30a is less than the diameter of the testing via 27. Therefore, a part of the testing via 27 is not cut away so that a part of the testing via 27 and a part of the metal segment 46 remain.

Referring to FIGS. 18 and 19, a bottom view and a side view of a semiconductor die according to another embodiment of the present invention are illustrated. The semiconductor die 3a of this embodiment is substantially similar to the semiconductor die 3 of FIGS. 15 and 16, and the difference between the semiconductor die 3a of this embodiment and the semiconductor die 3 of FIGS. 15 and 16 is described as follows. In addition to a part of the metal segment 46, a part of the testing via 27 remain in the semiconductor die 3a. Therefore, the semiconductor die 3a further comprises the conductive metal 26 extending from the metal segment 46 to the bottom surface 402 of the substrate 40. The metal segment 46 and the testing via 27 are exposed from the side surface 31 of the semiconductor die 3a. It is noted that the semiconductor die 3 of FIG. 1 may be replaced by the semiconductor die 3a of FIGS. 18 and 19.

Figure 20:
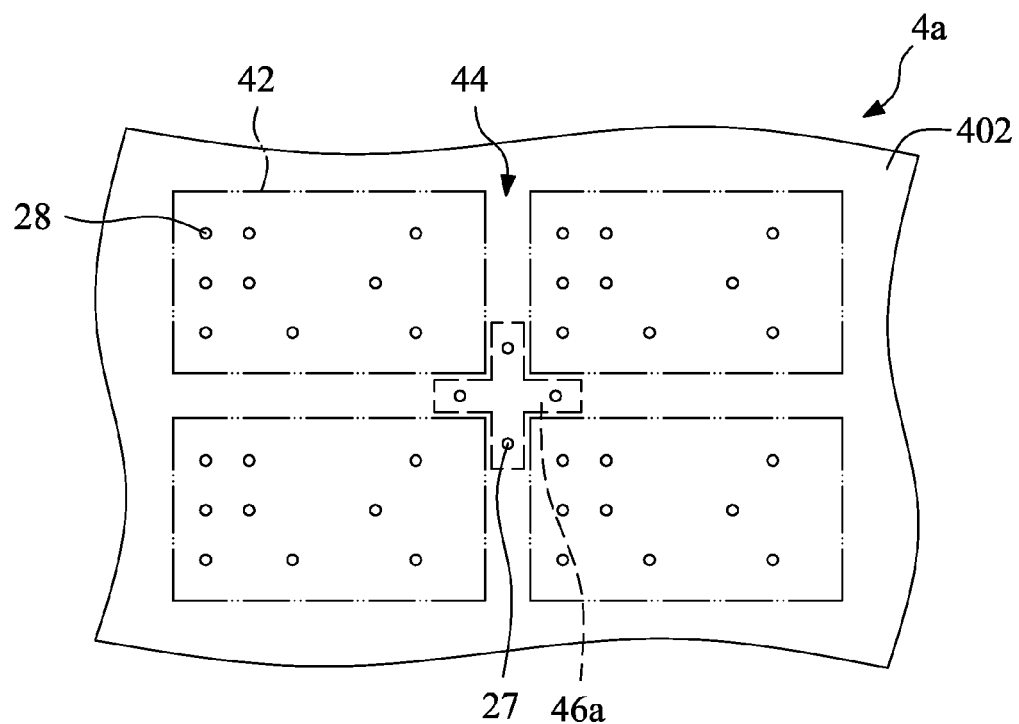
FIG. 20 illustrates a partially enlarged bottom view of a semiconductor wafer having a metal segment according to another embodiment of the present invention.

Referring to FIG. 20, a partially enlarged bottom view of a semiconductor wafer having the metal segment according to another embodiment of the present invention is illustrated. The semiconductor wafer 4a of this embodiment is substantially similar to the semiconductor wafer 4 of FIG. 2, and the difference between the semiconductor wafer 4a of this embodiment and the semiconductor wafer 1 of FIG. 2 is described as follows. The metal segment 46a of this embodiment is in a cross shape, and is disposed between four die areas 42. In addition, after the plating process, the positions of the testing vias 27 correspond to the four branches of the metal segment 46a respectively.

Figure 21:
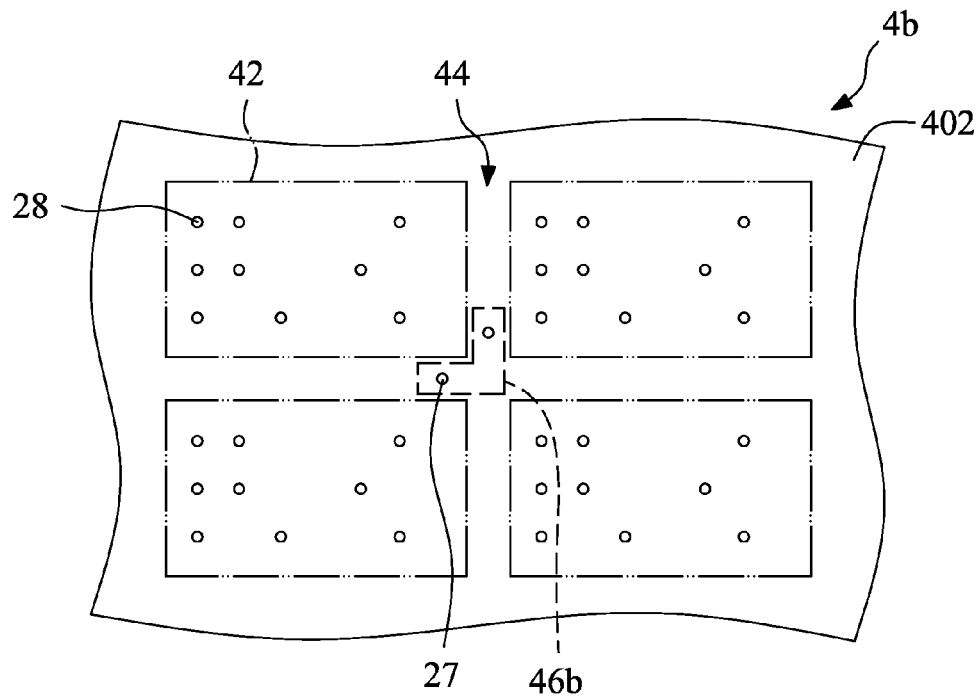
FIG. 21 illustrates a partially enlarged bottom view of a semiconductor wafer having the metal segment according to another embodiment of the present invention.

Referring to FIG. 21, a partially enlarged bottom view of a semiconductor wafer having the metal segment according to another embodiment of the present invention is illustrated.

The semiconductor wafer 4b of this embodiment is substantially similar to the semiconductor wafer 4 of FIG. 2, and the difference between the semiconductor wafer 4b of this embodiment and the semiconductor wafer 1 of FIG. 2 is described as follows. The metal segment 46b of this embodiment is in an L-shape, and is disposed around a corner of the die area 42. In addition, after the plating process, the positions of the testing vias 27 correspond to the end portions of the metal segment 46b respectively.

Figure 22:
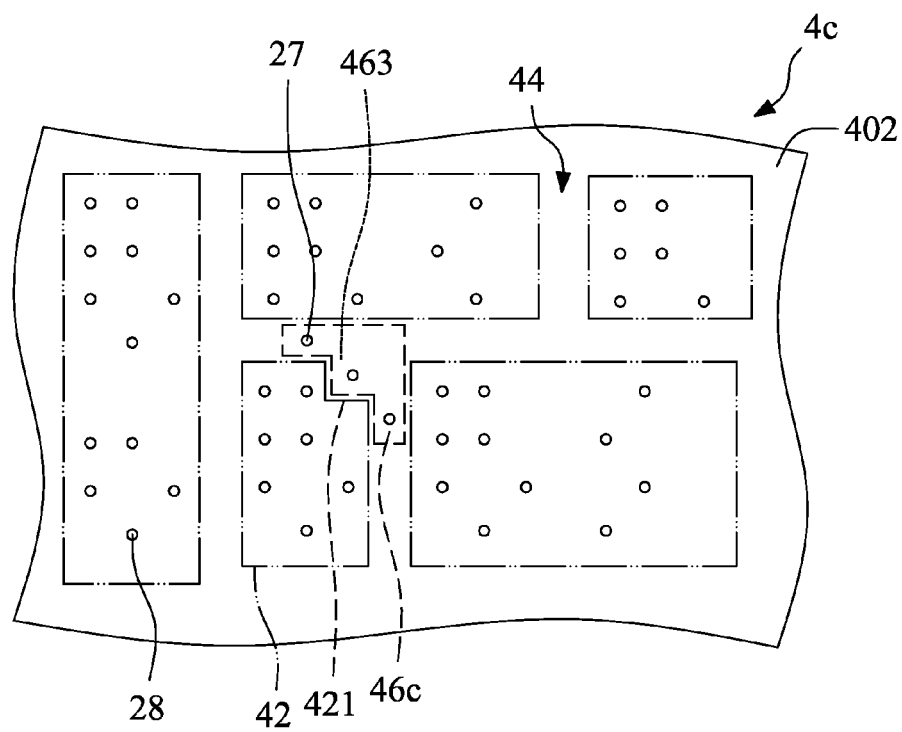
FIG. 22 illustrates a partially enlarged bottom view of a semiconductor wafer having the metal segment according to another embodiment of the present invention.

Referring to FIG. 22, a partially enlarged bottom view of a semiconductor wafer having the metal segment according to another embodiment of the present invention is illustrated. The semiconductor wafer 4c of this embodiment is substantially similar to the semiconductor wafer 4b of FIG. 21, and the difference between the semiconductor wafer 4c of this embodiment and the semiconductor wafer 4b of FIG. 21 is described as follows. At least one of the die areas 42 has a notch 421, and is not rectangular. That is, the die areas 42 are not arranged in an array. The metal segment 46c of this embodiment further has a protrusion portion 463 corresponding to the notch 421. In addition, after the plating process, at least one of the testing vias 27 is disposed at the position corresponding to the protrusion portion 463. It is noted that the protrusion portion 463 is not disposed in the sawing streets, thus, the protrusion portion 463 and the testing via 27 corresponding to the protrusion portion 463 may not be cut off during the sawing process.

Figure 23:
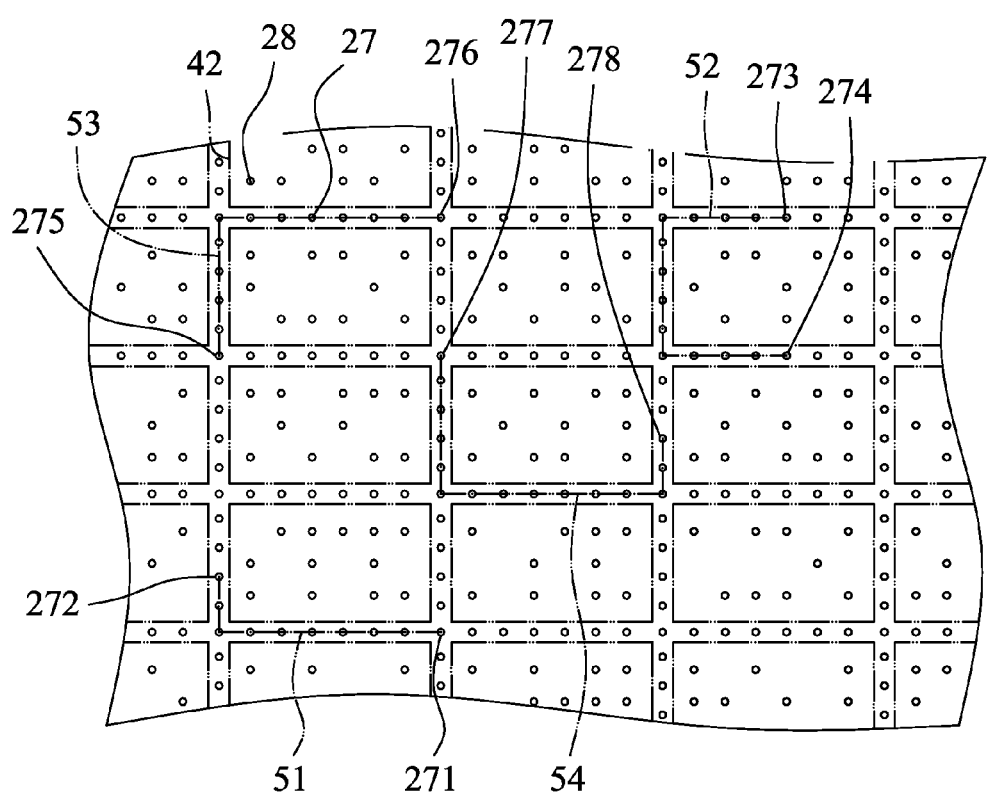
FIG. 23 illustrates a partially enlarged bottom view of semiconductor wafer probing of the metal segment according to another embodiment of the present invention.

Referring to FIG. 23, a partially enlarged bottom view of a semiconductor wafer showing the different probing paths according to another embodiment of the present invention is illustrated. In this embodiment, four probing paths are illustrated. The first probing path 51 is from the testing via 271 to the testing via 272, wherein the metal segment of the first probing path 51 is in a L shape, and is disposed around a corner of the die area 42. The second probing path 52 is from the testing via 273 to the testing via 274, wherein the metal segment of the second probing path 52 is in a C shape, and is disposed around two corners of the die area 42. The third probing path 53 is from the testing via 275 to the testing via 276, wherein the metal segment of the third probing path 53 is in a L shape, and is disposed around a corner of the die area 42. The fourth probing path 54 is from the testing via 277 to the testing via 278, wherein the metal segment of the fourth probing path 54 is in a U shape, and is disposed around two corners of the die area 42.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a semiconductor die, comprising:
      a substrate;
      a plurality of dielectric layers, disposed on the substrate;
      an integrated circuit, including a plurality of patterned metal layers disposed between the dielectric layers and electrically connected to each other; and
      at least one metal segment, insulated from the integrated circuit, exposed from a lateral side surface of the semiconductor die, and disposed on a dielectric layer which is the bottommost of the dielectric layers.

2. The semiconductor package of claim 1, wherein the at least one metal segment and a bottommost patterned metal layer of the integrated circuit each have lower surfaces which are substantially coplanar.

3. The semiconductor package as claimed in claim 1, wherein the semiconductor die further comprises at least one conductive via.

4. A semiconductor wafer, comprising:
   a substrate divided into a plurality of die areas and a plurality of trench areas;
   wherein each of the die areas includes an integrated circuit having a plurality of patterned metal layers disposed between dielectric layers and electrically connected to each other; and
   wherein the trench areas are disposed between the die areas, and at least one metal segment is disposed in the trench area on a bottommost dielectric layer and insulated from an integrated circuit of an adjacent die area.

5. The semiconductor wafer as claimed in claim 4, wherein the at least one metal segment and a bottommost patterned metal layer are coplanar at the same layer.

6. A semiconductor process, comprising:
   (a) providing a semiconductor wafer having a substrate, at least one metal segment, a plurality of integrated circuits and a plurality of dielectric layers, wherein the at least one metal segment, the integrated circuits and the dielectric layers are disposed on a top surface of the substrate, each of the integrated circuits includes a plurality of patterned metal layers disposed between the dielectric layers and electrically connected to each other, and the at least one metal segment is insulated from the integrated circuits and disposed on a bottommost dielectric layer;
   (b) forming a plurality of testing holes and inner holes from a bottom surface of the substrate to expose the at least one metal segment and a bottommost patterned metal layer of the integrated circuit, respectively;
   (c) forming a plurality of conductive metals in the testing holes and the inner holes, wherein the conductive metals in the testing holes are separated from each other; and
   (d) probing at least two of the conductive metals in two of the testing holes.

7. The semiconductor process of claim 6, wherein in step (a), the semiconductor wafer is defined as a plurality of die areas and a plurality of trench areas, each of the die areas has each of the integrated circuits, and the trench areas are disposed between the die areas.

8. The semiconductor process of claim 7, wherein in step (a), the at least one metal segment is disposed in the trench area.

9. The semiconductor process of claim 7, wherein in step (a), the at least one metal segment is disposed in the die areas.

10. The semiconductor process of claim 7, wherein the trench areas include saw streets.

11. The semiconductor process of claim 6, wherein in step (a), the at least one metal segment and a bottommost patterned metal layer of the integrated circuit are coplanar at the same layer.

12. The semiconductor process of claim 6, wherein in step (c), the conductive metals are plated on a sidewall of each of the testing holes and a sidewall of each of the inner holes.

13. The semiconductor process of claim 6, wherein in step (c), the conductive metals fill the testing holes and the inner holes.

14. The semiconductor process of claim 6, wherein in step (c), the conductive metals in the testing holes further extend to the bottom surface of the substrate to form a plurality of testing portions used to be probed in step (d).

15. The semiconductor process of claim 6, wherein in step (c), the conductive metals in the testing holes contact the at least one metal segment, and the conductive metals in the inner holes contact the bottommost patterned metal layer of the integrated circuit.

16. The semiconductor process of claim 7, further comprising a step of sawing the semiconductor wafer along the trench areas to form a plurality of semiconductor dice.

17. The semiconductor process of claim 8, further comprising a step of sawing the semiconductor wafer along the trench areas to remove the at least one metal segment and the conductive metals in the testing holes to form a plurality of semiconductor dice.

* * * * *